United States Patent
Lin et al.

(10) Patent No.: US 8,338,884 B2
(45) Date of Patent: Dec. 25, 2012

(54) SELECTIVE EPITAXIAL GROWTH OF SEMICONDUCTOR MATERIALS WITH REDUCED DEFECTS

(75) Inventors: Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 360 days.

(21) Appl. No.: 12/708,711

(22) Filed: Feb. 19, 2010

(65) Prior Publication Data

US 2010/0289116 A1 Nov. 18, 2010

Related U.S. Application Data

(60) Provisional application No. 61/177,549, filed on May 12, 2009.

(51) Int. Cl.
*H01L 21/00* (2006.01)
(52) U.S. Cl. . 257/327; 257/346; 257/396; 257/E21.131; 257/E21.265; 257/E21.426
(58) Field of Classification Search ............... 257/327, 257/346, 396, 397, 506, 622, 636, E21.131, 257/219, 265, 426, 548
See application file for complete search history.

(56) References Cited

U.S. PATENT DOCUMENTS

| | | | | |
|---|---|---|---|---|
| 3,978,428 | A * | 8/1976 | Burnham et al. | 372/46.012 |
| 5,084,407 | A * | 1/1992 | Boland et al. | 438/400 |
| 5,168,089 | A | 12/1992 | Feygenson et al. | |
| 5,311,533 | A * | 5/1994 | Stutius et al. | 372/46.01 |
| 6,046,483 | A * | 4/2000 | Tesauro et al. | 257/396 |
| 6,074,478 | A * | 6/2000 | Oguro | 117/95 |
| 6,087,709 | A * | 7/2000 | Gandy et al. | 257/626 |
| 6,180,978 | B1 * | 1/2001 | Chatterjee et al. | 257/327 |
| 8,173,551 | B2 * | 5/2012 | Bai et al. | 438/758 |
| 2007/0026629 | A1 * | 2/2007 | Chen et al. | 438/424 |
| 2011/0003450 | A1 * | 1/2011 | Lee et al. | 438/285 |
| 2011/0117732 | A1 * | 5/2011 | Bauer et al. | 438/507 |

OTHER PUBLICATIONS

Allen, C. E., et al., "Surface Diffusion of Ge on Si(111): Experiment and Simulation," Physical Review B, vol. 55, No. 19, May 15, 1997, pp. 13 304-13 313.
Bai, J., et al., "Study of the Defect Elimination Mechanisms in Aspect Ratio Trapping Ge Growth," Applied Physics Letters, vol. 90, 2007, pp. 101902-1-101902-3.
Fukuda, Y., et al., "Critical Thickness for the $Si_{1-x}Ge_x/Si$ Heterostructure," Japanese Journal of Applied Physics, vol. 29, No. 1, Jan. 1990, pp. L 20-L 22.
Hirayama, H., et al., "{311} Facets of Selectively Grown Epitaxial Si Layers on $SiO_2$-Patterned Si(100) Surfaces," Physical Review B, vol. 48, No. 23, Dec. 15, 1993, pp. 17 331-17 337 (10 pages).
Kitajima, H., et al., "Crystalline Defects in Selectively Epitaxial Silicon Layers," Japanese Journal of Applied Physics, vol. 22, No. 12, Dec. 1983, pp. L783-L785.

(Continued)

*Primary Examiner* — Michael Lebentritt
(74) *Attorney, Agent, or Firm* — Slater & Matsil, L.L.P.

(57) ABSTRACT

A semiconductor device includes a substrate formed of a first semiconductor material; two insulators on the substrate; and a semiconductor region having a portion between the two insulators and over the substrate. The semiconductor region has a bottom surface contacting the substrate and having sloped sidewalls. The semiconductor region is formed of a second semiconductor material different from the first semiconductor material.

18 Claims, 7 Drawing Sheets

OTHER PUBLICATIONS

Liang, Y., et al., "Critical Thickness Enhancement of Epitaxial SiGe Films Grown on Small Structures," Journal of Applied Physics, vol. 97, 2005, pp. 043519-1-043519-7.

Miyano, K., et al., "Facet-Free Si Selective Epitaxial Growth Adaptable to Elevated Source/Drain MOSFETs with Narrow Shallow Trench Isolation," Japanese Journal of Applied Physics, vol. 38, 1999, pp. 2419-2423.

Park, J.-S., et al., "Defect Reduction of Selective Ge Epitaxy in Trenches on Si(001) Substrates Using Aspect Ratio Trapping," Applied Physics Letters, vol. 90, 2007, pp. 052113-1-052113-3.

Park, J.-S., et al., "Defect Reduction and its Mechanism of Selective Ge Epitaxy in Trenches on Si(001) Substrates Using Aspect Ratio Trapping," Mater. Res. Soc. Symp. Proc., vol. 994, 2007, 6 pages.

Park, J.-S., et al., "Aspect Ratio Trapping, a New Approach to Heteroepitaxy of Ge and III-Vs on Si," ISTDM International SiGe Technology and Device Meeting, May 2008, 2 pages.

Tabiryan, N. V., et al., "Interaction of Light with a Transversely Moving Nonlinear Medium: Beyond Doppler Laser Velocimetry," Journal of Applied Physics, vol. 83, No. 1, Jan. 1, 1998, pp. 1-7.

Vescan, L., et al., "Strained $Si_{1-x}Ge_x$/Si Dots and Wires Grown by Selective Epitaxy," Journal de Physique IV, Colloque C5, Supplément au Journal de Physique II, vol. 5, Jun. 1995, pp. C5-55-C5-62.

* cited by examiner

US 8,338,884 B2

SELECTIVE EPITAXIAL GROWTH OF SEMICONDUCTOR MATERIALS WITH REDUCED DEFECTS

This application claims the benefit of the following provisionally filed U.S. patent application: application Ser. No. 61/177,549, filed May 12, 2009, and entitled "Selective Epitaxial Growth of Semiconductor Materials with Reduced Defects," which application is hereby incorporated herein by reference.

TECHNICAL FIELD

This invention relates generally to semiconductor devices, and particularly to semiconductor materials having reduced defects and methods for forming the same.

BACKGROUND

The speeds of metal-oxide-semiconductor (MOS) transistors are closely related to the drive currents of the MOS transistors, which drive currents are further closely related to the mobility of charges. For example, NMOS transistors have higher drive currents when the electron mobility in their channel regions is high, while PMOS transistors have higher drive currents when the hole mobility in their channel regions is high.

Germanium is a commonly known semiconductor material. The electron mobility and hole mobility of germanium are greater than that of silicon, which is the most commonly used semiconductor material in the formation of integrated circuits. Hence, germanium is an excellent material for forming integrated circuits. However, in the past, silicon gained more popularity since its oxide (silicon oxide) is readily usable in the gate dielectrics of MOS transistors. The gate dielectrics of the MOS transistors can be conveniently formed by thermally oxidizing silicon substrates. The oxide of germanium, on the other hand, is soluble in water, and hence is not suitable for the formation of gate dielectrics.

With the use of high-k dielectric materials in the gate dielectrics of MOS transistors, however, the convenience provided by the silicon oxide is no longer a big advantage, and hence germanium is reexamined for use in integrated circuits. In addition to germanium, compound semiconductor materials of group III and group V elements (referred to as III-V compound semiconductors hereinafter) are also good candidates for forming NMOS devices for their high electron mobility.

A challenge faced by the semiconductor industry is that it is difficult to form germanium films with high germanium concentrations or pure germanium films, or III-V compound semiconductor films. Particularly, it is difficult to form high-concentration germanium films with low defect densities and great thicknesses. Previous research has revealed that when a silicon germanium film is epitaxially grown from a blank silicon wafer, the critical thickness of the silicon germanium film reduces with the increase in the percentage of germanium in the silicon germanium film, wherein the critical thickness is the maximum thickness the silicon germanium film can reach without being relaxed. When relaxation occurs, the lattice structure will be broken, and defects will be generated. For example, when formed on blank silicon wafers, the critical thickness of a silicon germanium film having a 20 percent germanium percentage may be about 10 nm to about 20 nm. To make things worse, when the germanium percentage increases to 40, 60, and 80 percent, the critical thicknesses are reduced to about 6-8 nm, 4-5 nm, and 2-3 nm, respectively. When the thickness of germanium films exceeds the critical thickness, the defects may reach as high as about $1 \times 10^8 / cm^2$. Accordingly, it is not feasible to form germanium films on blank silicon wafers for the purpose of forming MOS transistors, particularly fin field-effect transistors (FinFETs).

Previous research has disclosed methods for forming germanium regions from recesses between shallow trench isolation (STI) regions 4. FIG. 1 illustrates a conventional structure. STI regions 4 are formed in silicon substrate 2. Recesses are formed in silicon substrate 2 between STI regions 4, followed by growing germanium regions 6 in the recesses. The defect density of germanium regions 6 formed using this method is much lower than the defect density of germanium films grown on blank silicon substrates, sometimes by two orders. However, undesirable facets 8 may be formed by this formation method. On the other hand, the defect density is still high for forming high-performance MOS transistors.

SUMMARY OF THE INVENTION

In accordance with one aspect of the present invention, a semiconductor device includes a substrate formed of a first semiconductor material; two insulators on the substrate; and a semiconductor region having a portion between the two insulators and over the substrate. The semiconductor region has a bottom surface contacting the substrate and having sloped sidewalls. The semiconductor region includes a second semiconductor material different from the first semiconductor material.

Additional embodiments are provided.

The advantageous features of the present invention include reduced defect density in the epitaxially grown semiconductor materials. Further, the top surfaces of the epitaxially grown semiconductor materials are substantially flat with substantially no facets.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel methods of epitaxially growing low-defect semiconductor materials are presented. The intermediate stages of manufacturing embodiments of the present invention are illustrated. The variations of the embodiments are discussed. Throughout the various views and illustrative embodiments of the present invention, like reference numbers are used to designate like elements.

Figure 1:
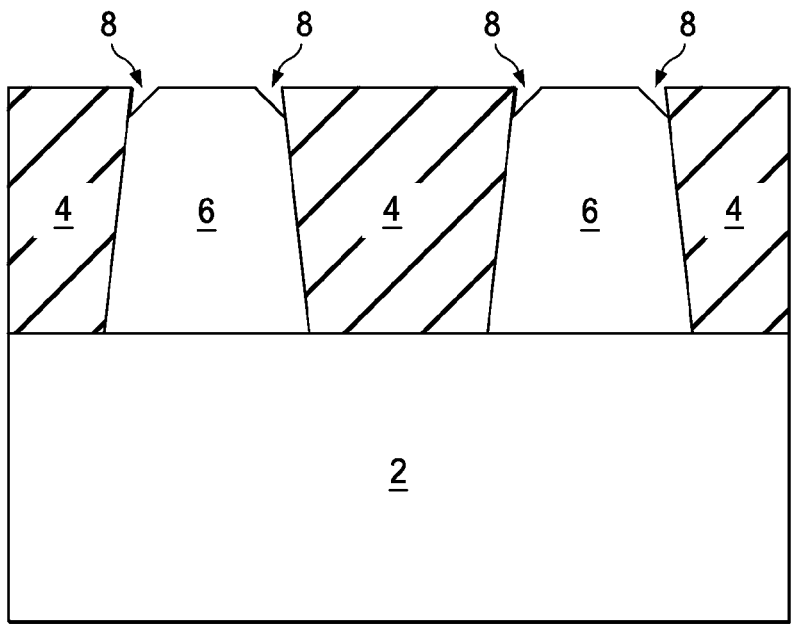
FIG. 1 illustrates a cross-sectional view of a conventional structure with a semiconductor material grown from recesses between shallow trench isolation regions.
Figure 2:
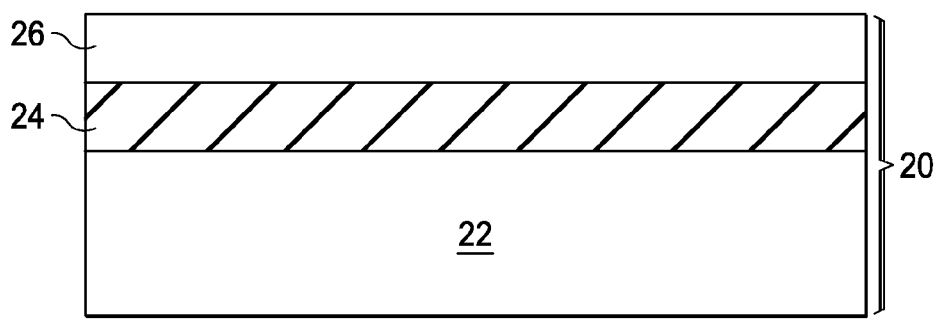
FIGS. 2 through 10B illustrate cross-sectional views of intermediate stages in the manufacturing of a first semiconductor structure, wherein semiconductor materials are epitaxially grown from undercuts under an oxide layer.

FIGS. 2 through 10 illustrate a first embodiment. Referring to FIG. 2, substrate 20 is provided. In an embodiment, substrate 20 is a silicon-on-insulator (SOI) substrate, which includes semiconductor layer 22, buried oxide (BOX) layer 24, and semiconductor top layer 26. Semiconductor top layer 26 may be formed of silicon, and herein is referred to as silicon layer 26 hereinafter, although it may also be formed of other semiconductor materials such as silicon germanium (SiGe), silicon carbon (SiC), GaAs, or the like.

Figure 3:
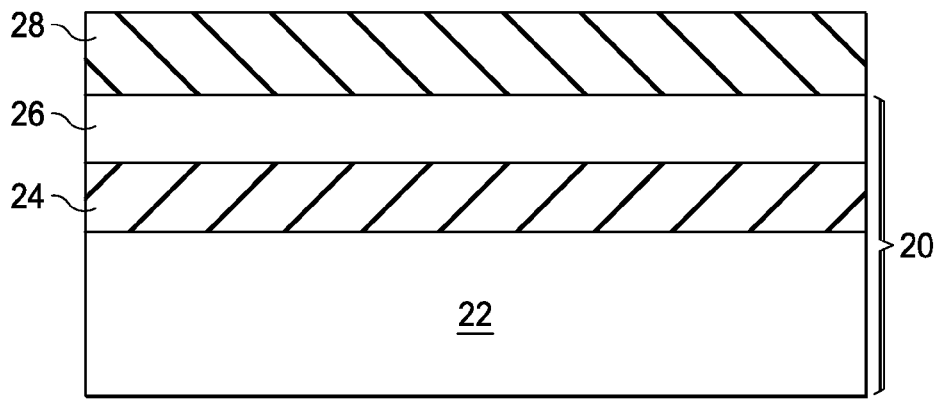
Figure 4:
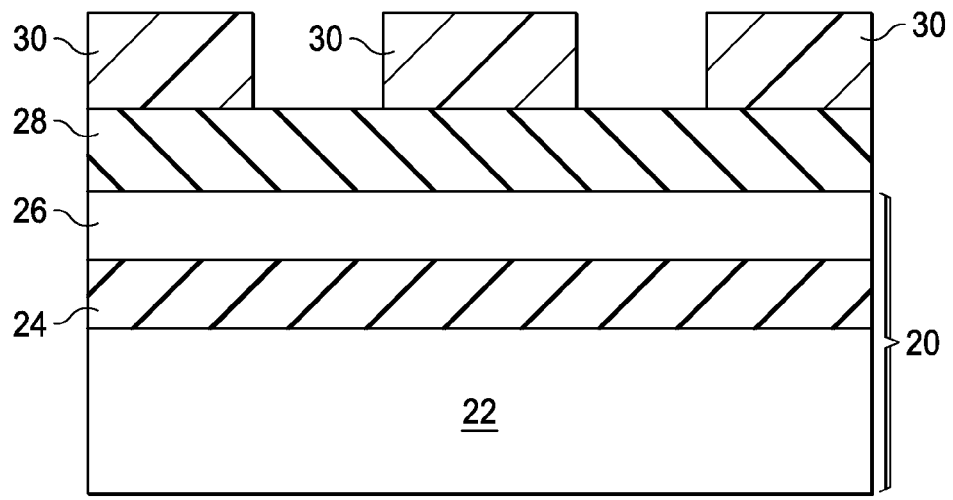
Figure 5:
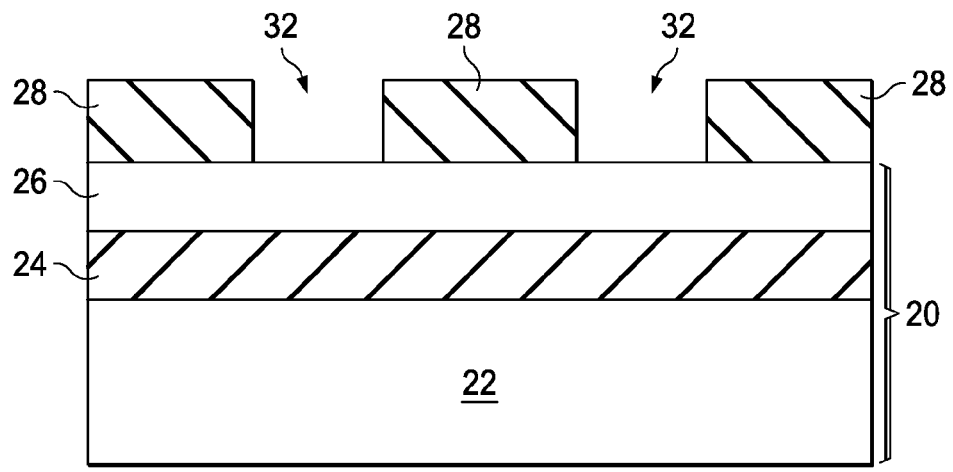

FIGS. 3-5 illustrate the formation and patterning of mask layer 28. Referring to FIG. 3, mask layer 28 is formed on silicon layer 26. Mask layer 28 may comprise silicon oxide, which may be formed, for example, by thermally oxidizing a top layer of silicon layer 26. Alternatively, mask layer 28 may be formed by a deposition method such as one of the chemical vapor deposition methods. The materials of mask layer 28 may include, but are not limited to, silicon oxide, silicon nitride, silicon oxynitride, and the like. Mask layer 28 may have a thickness between about 200 nm and about 450 nm. It is realized, however, that the dimensions recited throughout the description are merely examples, and may be changed if different formation technologies are used. Photo resist 30 is formed on mask layer 28 and then patterned, as is shown in FIG. 4.

Figure 6:
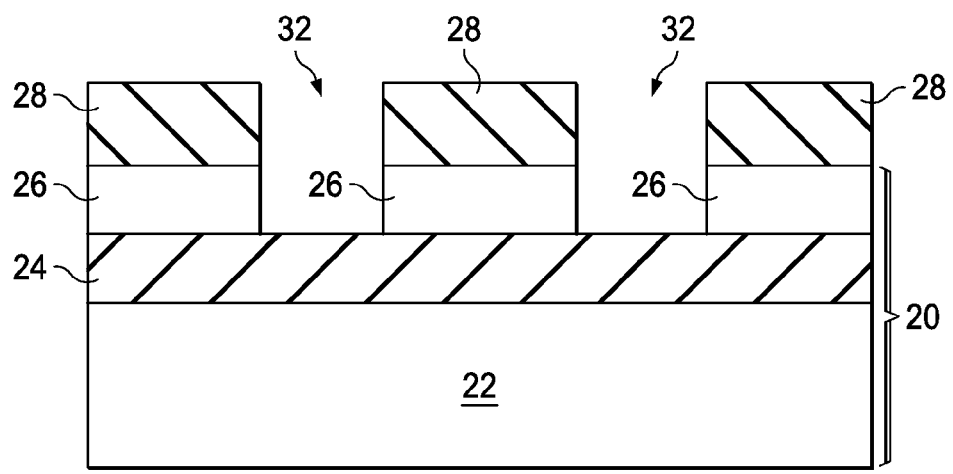

Referring to FIG. 5, mask layer 28 is patterned, forming openings 32 in mask layer 28, wherein the patterning of mask layer 28 may include dry etching. After the patterning, silicon layer 26 is exposed through openings 32. Photo resist 30 is then removed. Next, as shown in FIG. 6, the exposed portions of silicon layer 26 are etched, so that openings 32 extend downward into silicon layer 26. During the etching of silicon layer 26, the patterned mask layer 28 is used as a mask. BOX layer 24 may be exposed through openings 32. In an embodiment, the etching of silicon layer 26 is anisotropic, which may be performed by dry etching.

Figure 7:
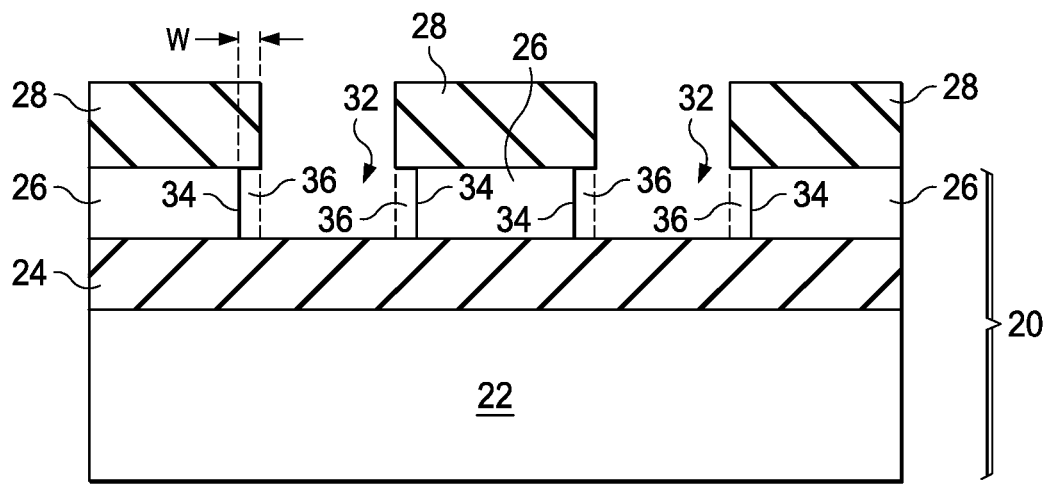

FIG. 7 illustrates the lateral etching of silicon layer 26 to form undercuts 36, so that openings 32 expand laterally under mask layer 28. In an embodiment, the lateral etching may be performed by isotropic etching, for example, wet etching. Preferably, sidewalls 34 of silicon layer 26, which sidewalls 34 are exposed through openings 32, are straight or substantially straight, instead of rounded. Sidewalls 34 may also be vertical or substantially vertical. Width W of undercuts 36 may be greater than about 10 nm, or greater than about 20 nm, or even greater than about 50 nm, although a smaller width W is also usable.

Figure 8A:
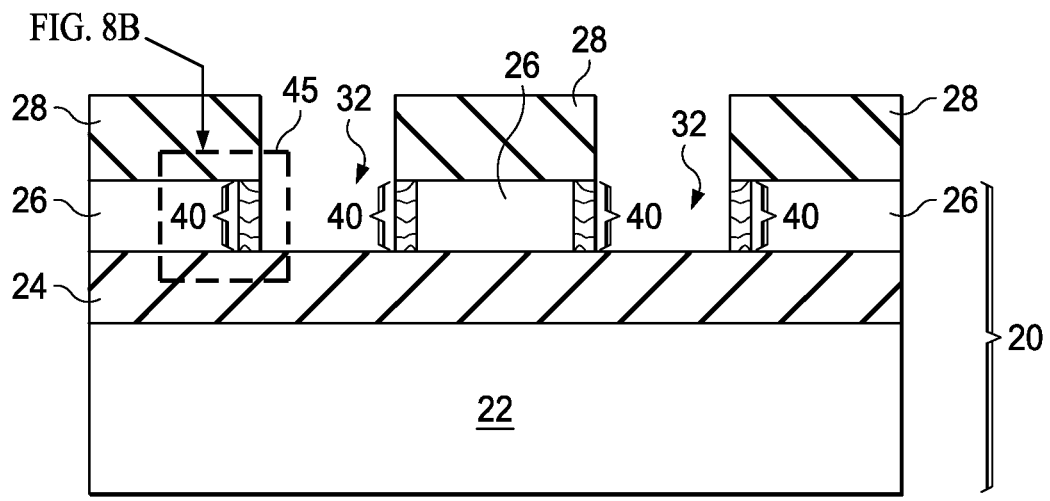

FIGS. 8A through 10 schematically illustrate the formation of semiconductor material 40. Referring to FIG. 8A, semiconductor material 40, which comprises a material different from the material of silicon layer 26, is grown starting from silicon layer 26 by, for example, selective epitaxial growth. No semiconductor material 40 will be grown starting from mask layer 28 and BOX layer 24. Therefore, semiconductor material 40 will be grown in undercuts 36 (refer to FIG. 7). In an embodiment, semiconductor material 40 comprises silicon germanium, which is expressed as $Si_{1-x}Ge_x$, wherein x is the atomic percentage of germanium in the silicon germanium, and may be greater than 0 and equal to or less than 1. When x is equal to 1, semiconductor material 40 is formed of pure germanium. In alternative embodiments, semiconductor material 40 comprises a compound semiconductor material of a III-V compound semiconductor, which may include, but is not limited to, GaAs, InP, GaN, InGaAs, InAlAs, GaAs, GaSb, AlSb, AlAs, AlP, GaP, combinations thereof, and multi-layers thereof. In yet other embodiments, semiconductor material 40 may be a bi-layer including lower layer $40_1$ and upper/top layer $40_2$ (not shown in FIGS. 8A and 8B, please refer to FIG. 10B), wherein lower layer $40_1$ may include SiGe and act as a buffer layer, while upper layer $40_2$ may include pure, or substantially pure, germanium, for example, with the germanium concentration greater than about 95 percent, or even greater than about 99 percent. When used as a buffer layer, lower layer $40_1$ has a lattice constant between the lattice constant of upper layer $40_2$ and the lattice constant of substrate 20. Alternatively, lower layer $40_1$ includes silicon germanium, pure germanium, or substantially pure germanium, while upper layer $40_2$ includes a III-V compound semiconductor material.

Figure 8B:
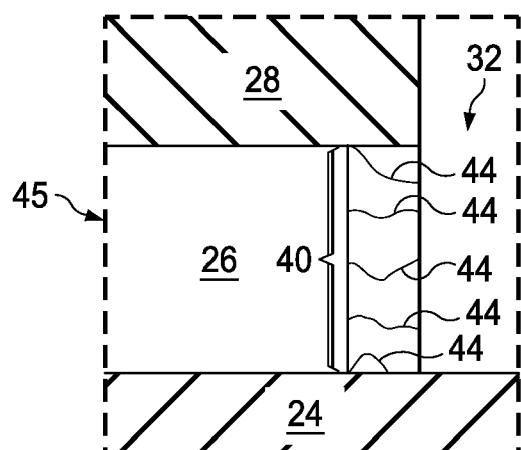

FIG. 8B illustrates a magnified view of portion 45 of the structure shown in FIG. 8A. Since semiconductor material 40 is different from the material of silicon layer 26, defects, which are schematically illustrated using lines 44, will be generated and will grow as the deposition of semiconductor material 40 proceeds. It is realized that the direction of defects 44 may have lateral components and vertical components. A significant portion of vertical defects 44 may very likely run into mask layer 28 or BOX layer 24, and will be stopped. As a result, what will be left and will continue to grow are lateral defects 44, as are shown in both FIGS. 8A and 8B.

Figure 9:
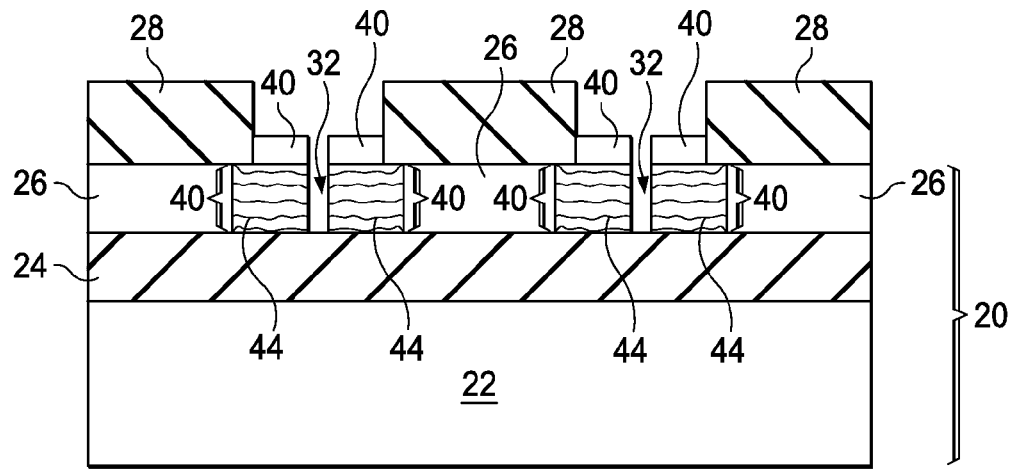

With the proceeding of the growth of semiconductor material 40, more vertical defects 44 (or defects 44 with vertical components) will be stopped by mask layer 28 or BOX layer 24, while lateral defects 44 may continue to grow to the centers of openings 32, as is shown in FIG. 9. It is realized that a greater width W of undercuts 36 (refer to FIG. 7) is beneficial for the stopping of lateral defects 44.

Figure 10A:
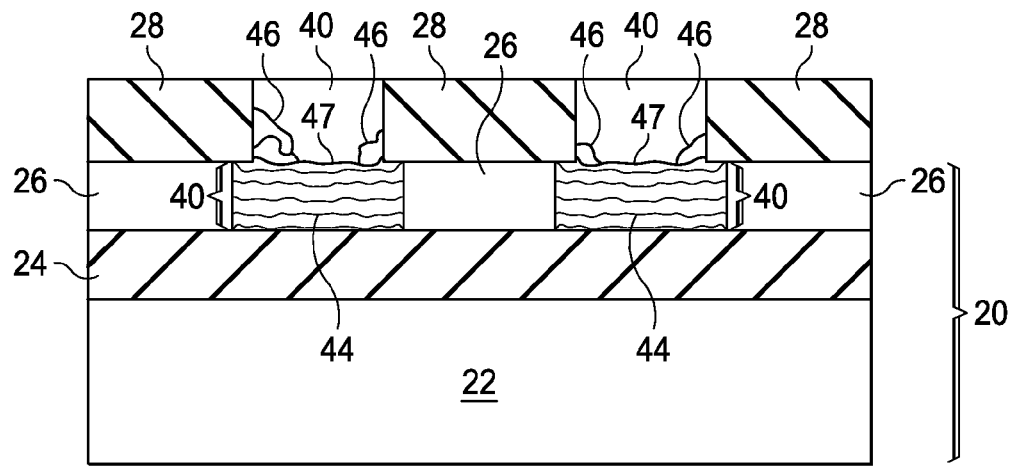

Referring to FIG. 10A, the epitaxial growth of semiconductor material 44 continues until it is substantially level with, or higher than or lower than, the top surface of mask layer 28, for example, with a vertical difference less than about 50 Å, although a greater or lesser difference is also possible. The top portion of semiconductor material 40 is formed of a material desired for the MOS device formed thereon. For example, if a PMOS device is to be formed at semiconductor material 40, the top portion of semiconductor material 40 may include a high-hole-mobility material such as germanium. If however, an NMOS device is to be formed at semiconductor material 40, the top portion of semiconductor material 40 may include germanium or a high-electron-mobility material such as a III-V compound semiconductor material including, but not limited to, GaAs, InP, GaN, InGaAs, InAlAs, GaAs, GaSb, AlSb, AlAs, AlP, GaP, combinations thereof, and multi-layers thereof The top portion of semiconductor material 40 may also include an InGaAs quantum well or a superlattice layer.

Figure 10B:
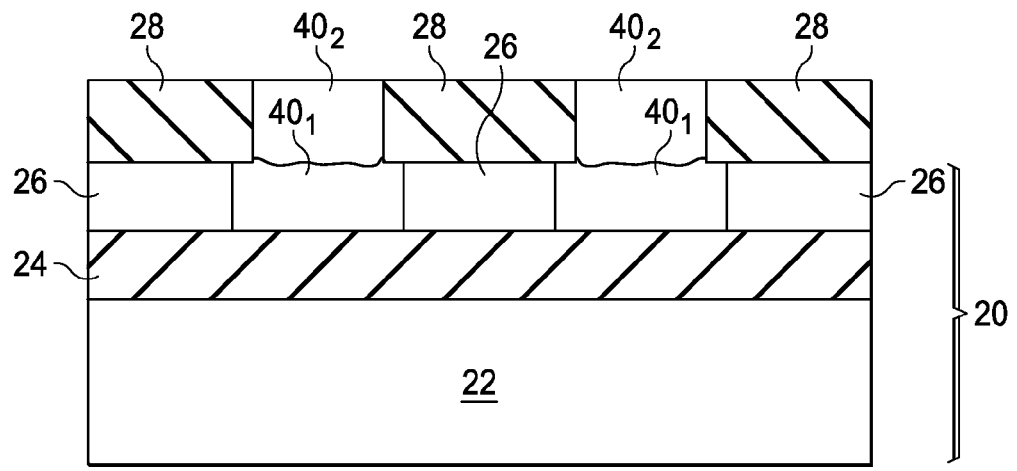

FIG. 10B illustrates lower layer $40_1$ and upper layer $40_2$ of epitaxially grown semiconductor material 40. As addressed in the preceding paragraphs, lower layer $40_1$ and upper layer $40_2$ may have different compositions. In addition, the interface between lower layer $40_1$ and upper layer $40_2$ may be lower than, higher than, or level with the interface between BOX layer 24 and semiconductor layer 26.

Semiconductor material 40 may have a substantially uniform composition from bottom to top. Alternatively, semiconductor material 40 may have a gradient structure with the composition changing gradually (either continuously or in stages) from bottom to top. In an embodiment, lower portion $40_1$ has a lower germanium atomic percentage than upper portion $40_2$, wherein the germanium atomic percentage may be gradient. When semiconductor material 40 comprises a germanium lower layer $40_1$ and a III-V compound semiconductor upper layer $40_2$, the interface (illustrated as dotted line 47 in FIG. 10A) between the germanium lower layer $40_1$ and the III-V compound semiconductor upper layer $40_2$ is preferably lower than the interface between silicon layer 26 and oxide layer 28.

It is realized, however, that in the formation of upper portion $40_1$, new defects 46 may occur (see FIG. 10A). However, the growth of defects 46 may be stopped by mask layer 28, as is schematically illustrated in FIG. 10A. Therefore, the defects in semiconductor material 40 are reduced in two steps. First, when grown in undercuts 36 (refer to FIGS. 7 and 8A), a significant portion of defects 44 having vertical components is eliminated. Although defects 44 with horizontal portions are left, horizontal defects 44 will not continue into upper portion $40_2$, and thus are also eliminated. Second, when semiconductor material 40 is grown in mask layer 28, mask layer 28 may also stop defects 46. Accordingly, in the resulting semiconductor material 40, particularly top portion $40_2$ of semiconductor material 40, the defect density is significantly reduced.

Figure 11:
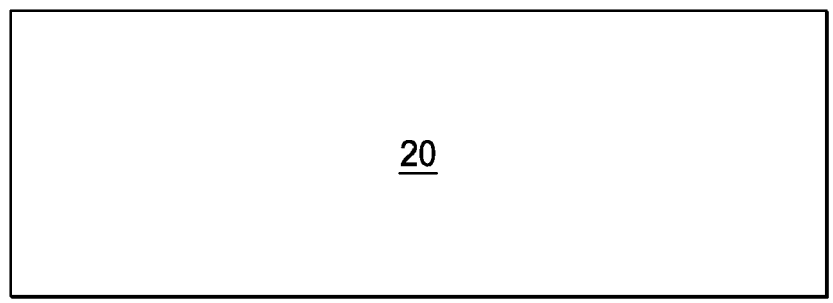
FIGS. 11 through 15 illustrate cross-sectional views of intermediate stages in the manufacturing of a second semiconductor structure, wherein semiconductor materials are epitaxially grown from openings in an oxide layer, with the openings extending below the bottom surface of the oxide layer.

FIGS. 11 through 15 illustrate a second embodiment. Referring to FIG. 11, semiconductor substrate 20 is provided. In an embodiment, semiconductor substrate 20 is a bulk silicon substrate comprising pure, or substantially pure, silicon. In alternative embodiments, semiconductor substrate 20 may be formed of other commonly used semiconductor materials such as silicon germanium (SiGe), silicon carbon (SiC), GaAs, or the like. Alternatively, silicon substrate 20 may also have a silicon-on-insulator (SOI) structure similar to what is shown in FIG. 2.

Figure 12:
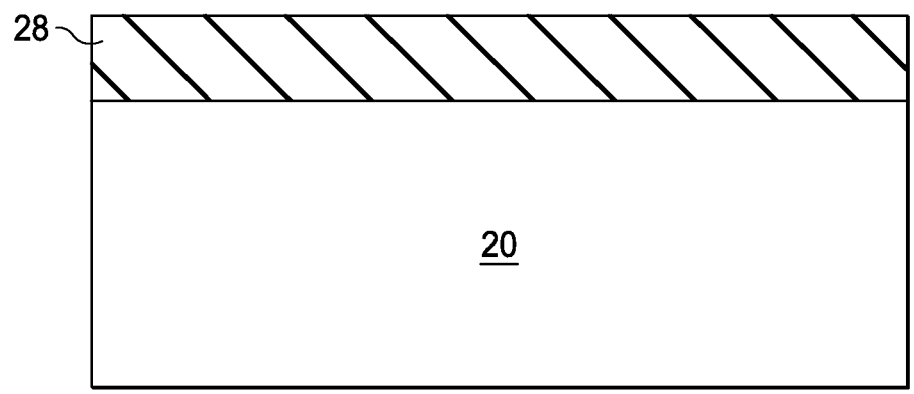
Figure 13:
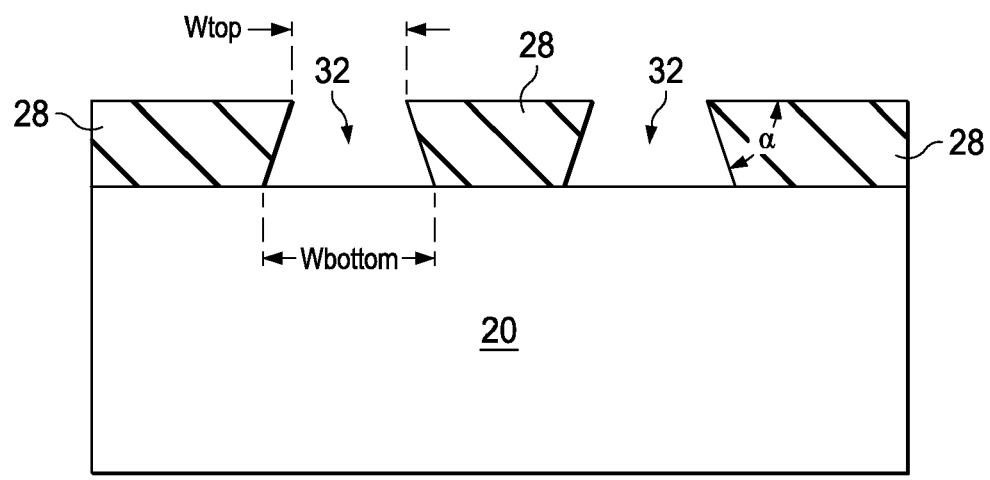

Next, as shown in FIG. 12, mask layer 28 is formed on semiconductor substrate 20. The material and the formation process of mask layer 28 may be essentially the same as discussed in the first embodiment. In FIG. 13, mask layer 28 is patterned, for example by etching, and hence openings 32 are generated. Preferably, openings 32 have a slanted profile with top width Wtop being smaller than bottom width Wbottom. This may be achieved by tuning the etching recipe. Alternatively, openings 32 may have sidewalls that are substantially vertical. In an exemplary embodiment, the slant angle α of the sidewalls of openings 32 may be between about 90 degrees and about 80 degrees, and even between about 89 degrees and about 84 degrees. In an exemplary embodiment, top width Wtop may be smaller than about 100 µm.

Figure 14:
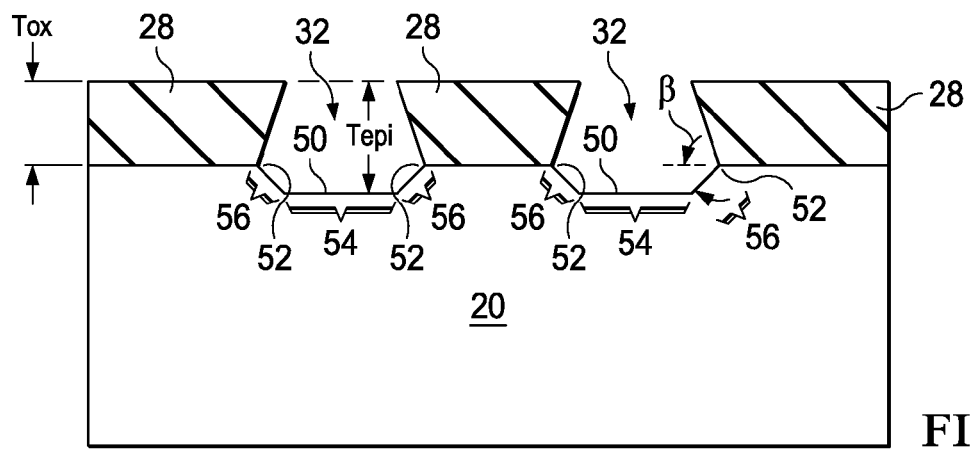

FIG. 14 illustrates the etching of semiconductor substrate 20 through openings 32, so that openings 32 extend into semiconductor substrate 20. The resulting openings 32 have central bottoms 50 lower than the bottom surface of mask layer 28. The depth Tepi of openings 32 at central bottoms 50 is thus greater than the thickness Tox of mask layer 28. In an embodiment, the difference (Tepi-Tox) may be greater than about 5 nm, or even greater than about 20 nm, or even greater than about 50 nm, although smaller differences are also applicable. In an embodiment, the etching of semiconductor substrate 20 may use a different etchant from the etchant used in the formation of opening 32. For example, the etching of semiconductor substrate 20 may use HCl as an etchant, while the etching of mask layer 28 may use $CF_4$ as an etchant.

On the other hand, the bottoms of openings 32 may extend substantially close to, or adjoin, the bottom inner corners 52 of mask layer 28. In other words, the bottom surfaces of openings 32 may continuously extend from bottom inner corners 52 (or points close to bottom inner corners 52) of mask layer 28 to the respective central bottoms 50. The bottom surfaces of openings 32 may include central portions 54 that surround the respective central bottoms 50, and outer portions 56 that surround the respective central portions 54. In an embodiment, central portions 54 are substantially flat, while outer portions 56 are slanted (sloped). Outer portions 56 may have substantially straight sidewalls having, for example, surface orientations {111}, {311}, {11(10)}, or the like. Alternatively, outer portions 56 may have curved (rounded) profiles. Such profiles may be formed by etching substrate 20 using, for example, HCl gas, wherein the etching temperature may be between about 750° C. and about 900° C. In an exemplary embodiment, the slant angle β of outer portions 56 is between about 5 degrees and about 50 degrees, and may even be between about 5 degrees and about 45 degrees. The connecting portions between portions 54 and 56 may also be rounded.

Figure 15:
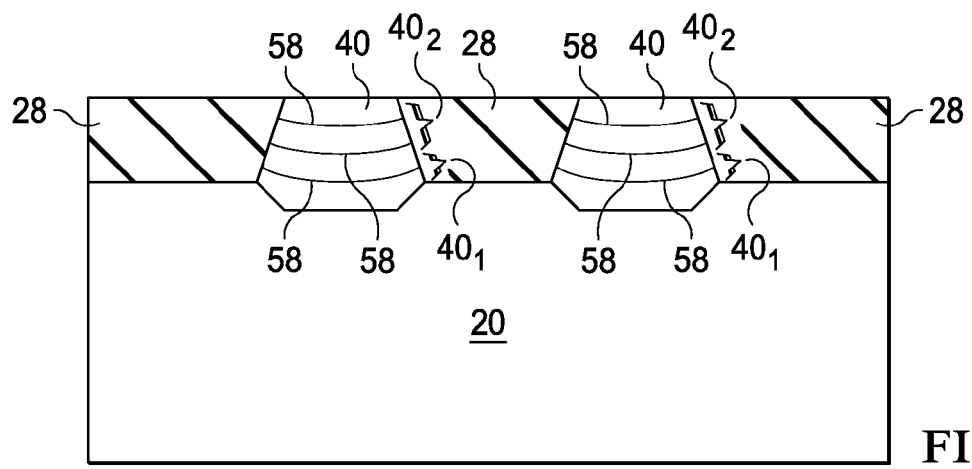

Next, as shown in FIG. 15, semiconductor material 40 is epitaxially grown in openings 32. Semiconductor material 40 may be essentially the same as discussed in the first embodiment, and hence is not repeated in detail herein. The top surface of semiconductor material 40 may be substantially level with the top surface of mask layer 28. Again, semiconductor material 40 may include a single layer such as SiGe, germanium, or a III-V semiconductor material, bi-layers including pure germanium on silicon germanium, or a III-V semiconductor layer on germanium or silicon germanium, or triple layers including III-V semiconductor on pure germanium, which is further on silicon germanium. Also, semiconductor material 40 may include a gradient layer with the composition changing gradually (either continuously or in stages) from lower portions to upper portions. Please note that the interface between semiconductor material 40 and substrate 20 may have a same profile as the bottom surfaces of opening 32, as are illustrated (and discussed) in FIG. 14.

During the epitaxial growth of semiconductor material 40, since the portions of semiconductor material 40 adjoining mask layer 28 have different surface energies than portions away from mask layer 28 (for example, the central portions), at the central bottoms 50 of openings 32, the growth rate is greater than at the outer portions of openings 32. Therefore, the non-flat profile of openings 32 shown in FIG. 14 is gradually compensated for by the difference in the growth rates. Eventually, the top surface of semiconductor material 40 is substantially flat. In addition, the recipe of the epitaxial growth may be adjusted to further level the top surface of semiconductor material 40. Lines 58 schematically illustrate how the top surface of semiconductor material 40 becomes flatter and flatter with the proceeding of the growth of semiconductor material 40. Accordingly, no planarization step (including, for example, chemical mechanical polish (CMP)) is needed, while the top surface of semiconductor material 40 is still substantially flat with no observable facets formed. Again, semiconductor material 40 may include upper portion $40_2$ and lower portion (buffer) $40_1$, wherein upper portion $40_2$ and the lower portion $40_1$ may have the compositions as discussed in preceding paragraphs.

Figure 16:
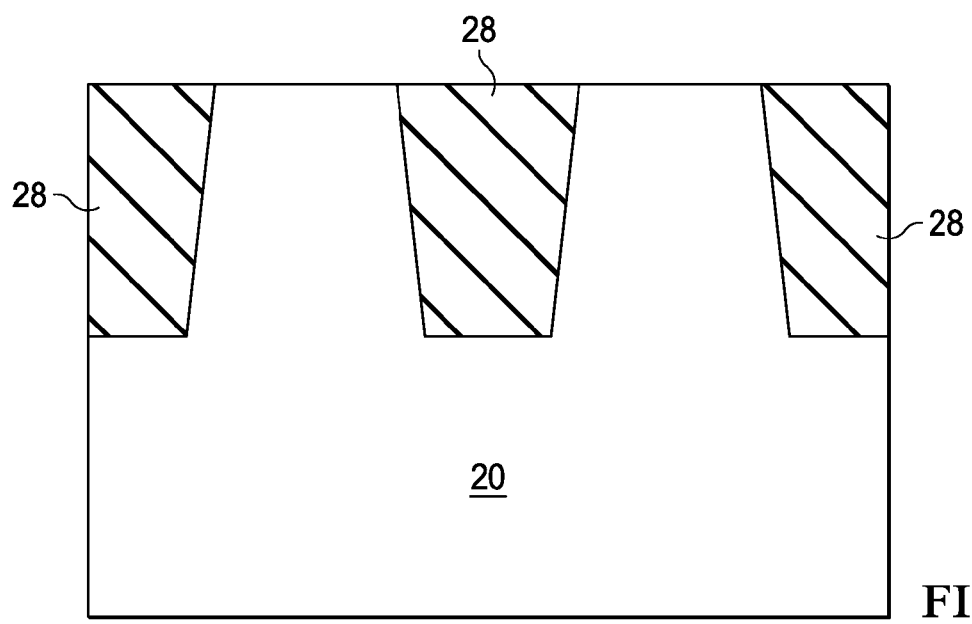
FIGS. 16 through 18 illustrate cross-sectional views of intermediate stages in the manufacturing of a third semiconductor structure, wherein semiconductor materials are epitaxially grown from openings between shallow trench isolation (STI) regions, with the openings extending below the bottom surfaces of the STI regions.
Figure 17:
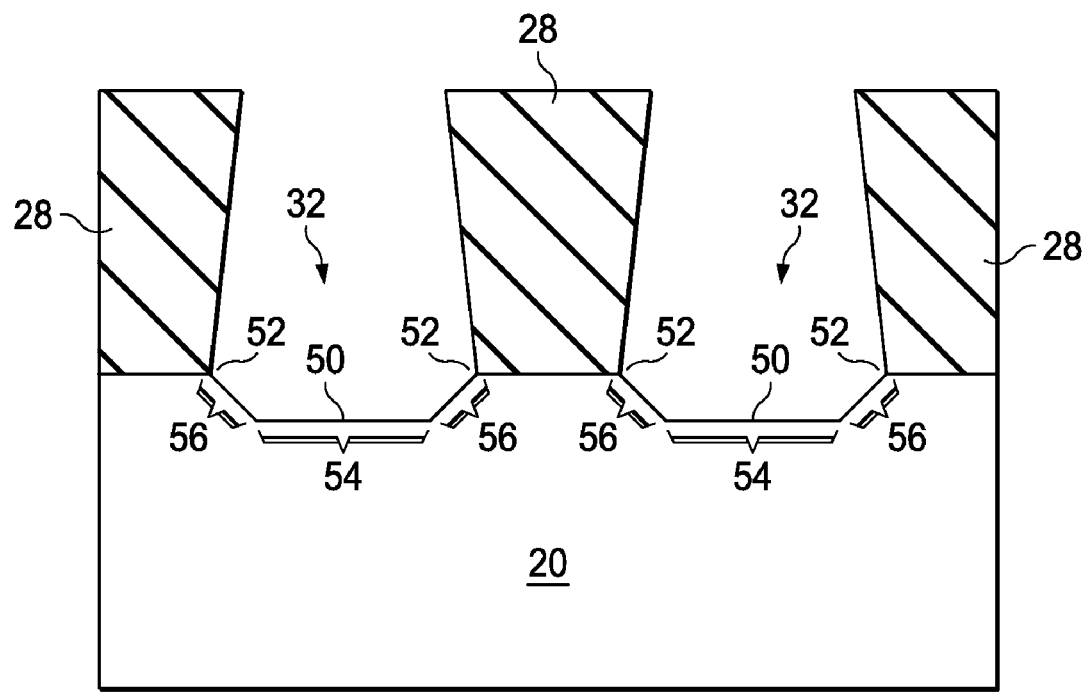
Figure 18:
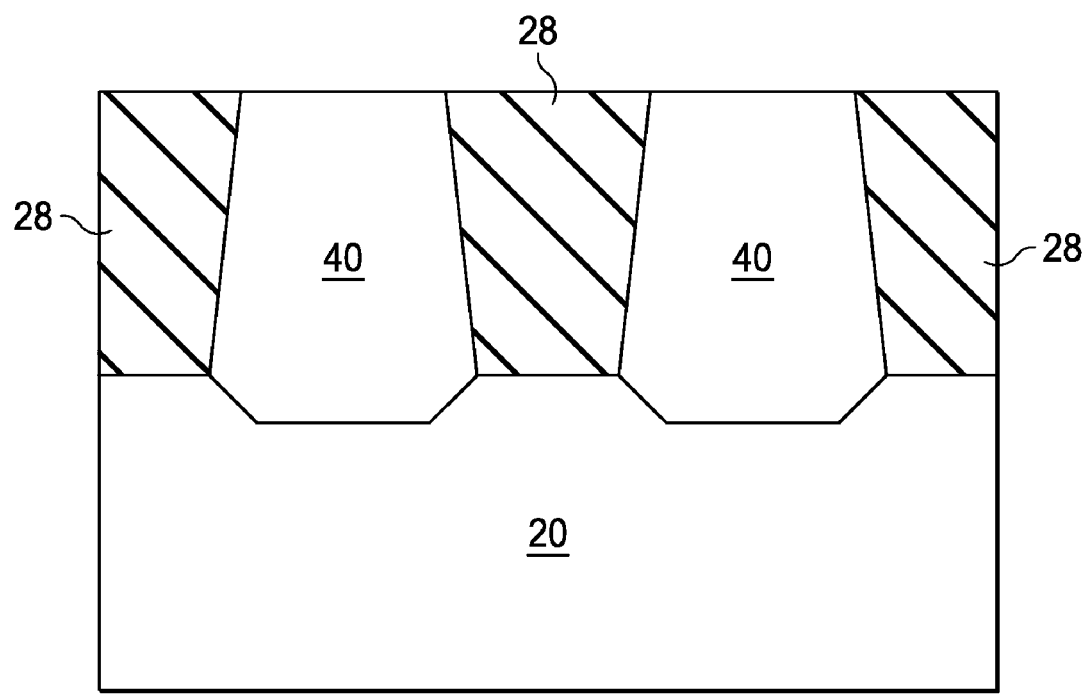

FIGS. 16 through 18 illustrate a third embodiment of the present invention. In this embodiment, mask layer 28, instead of being formed on the surface of semiconductor substrate 20, is formed in semiconductor substrate 20 in the form of shallow trench isolation (STI) regions. The process steps for forming STI regions 28 are known in the art, and hence are not repeated herein. Referring to FIG. 16, mask layer 28 that includes STI regions 28 is formed. The portions of semiconductor substrate 20 exposed through mask layer 28 are then recessed to form openings 32, as is shown in FIG. 17. Next, semiconductor material 40 is formed in openings 32. Again, the details of openings 32 (and corresponding regions 54 and 56) and semiconductor material 40 are essentially the same as in the first and the second embodiments, and are not repeated herein. Again, in the third embodiment, with the centers of openings 32 being lower than outer bottom surfaces, the resulting semiconductor material 40 has a substantially flat top surface.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A semiconductor device comprising:
   a substrate formed of a first semiconductor material;
   two insulators on the substrate; and
   a semiconductor region having a portion between the two insulators and over the substrate, wherein the semiconductor region has sloped sidewalls and a bottom surface contacting the substrate, wherein a top portion of the semiconductor region has a smaller width than a bottom portion of the semiconductor region, and wherein the semiconductor region comprises a second semiconductor material different from the first semiconductor material.

2. The semiconductor device of claim 1, wherein the sloped sidewalls have a slant angle between about 90 degrees and about 80 degrees.

3. The semiconductor device of claim 2, wherein the slant angle is between about 89 degrees and about 84 degrees.

4. The semiconductor device of claim 1, wherein the semiconductor region comprises:
   a top portion comprising the second semiconductor material; and
   a buffer layer between the top portion of the semiconductor region and the substrate, wherein the buffer layer has a lattice constant between a lattice constant of the top portion and a lattice constant of the substrate.

5. The semiconductor device of claim 1, wherein the bottom surface of the semiconductor region comprises a central portion, and outer portions surrounding the central portion, wherein the central portion is lower than the outer portions.

6. The semiconductor device of claim 5, wherein the central portion is lower than a bottom surface of the two insulators by greater than about 5 nm.

7. The semiconductor device of claim 5, wherein the outer portions have a surface orientation selected from the group consisting essentially of {111}, {311}, and {11(10)}.

8. The semiconductor device of claim 1, wherein the substrate comprises substantially pure silicon, and the second semiconductor material comprises germanium.

9. The semiconductor device of claim 1, wherein the second semiconductor material comprises a compound semiconductor material comprising a group III element and a group V element.

10. The semiconductor device of claim 1, wherein the substrate is a semiconductor substrate, and wherein the two insulators are formed on a top surface of the semiconductor substrate.

11. The semiconductor device of claim 1, wherein the two insulators comprise shallow trench isolation (STI) regions.

12. A semiconductor device comprising:
    a semiconductor substrate formed of a first semiconductor material;
    at least two insulators in the semiconductor substrate; and
    a second semiconductor material different from the first semiconductor material between the at least two insulators, wherein the second semiconductor material comprises a top surface substantially level with a top surface of the at least two insulators, and a bottom surface lower than a bottom surface of the at least two insulators, and wherein a top portion of the second semiconductor material has a smaller width than a bottom portion of the second semiconductor material.

13. The semiconductor device of claim 12, wherein the bottom surface of the second semiconductor material comprises a central portion lower than the bottom surface of the at least two insulators by greater than about 5 nm.

14. The semiconductor device of claim 13, wherein the bottom surface of the second semiconductor material further comprises outer portions surrounding the central portion, and wherein the central portion is substantially flat, and the outer portions are slanted with portions closer to the central portion being lower than portions farther away from the central portion.

15. The semiconductor device of claim 14, wherein the outer portions have a straight profile.

16. A semiconductor device comprising:
    a semiconductor substrate formed of a first semiconductor material;
    insulation regions extending from a top surface of the semiconductor substrate into the semiconductor substrate, wherein the insulation regions comprise opposite sidewalls facing each other; and
    a second semiconductor material different from the first semiconductor material between the opposite sidewalls of the insulation regions, wherein a top portion of the second semiconductor material has a smaller width than a bottom portion of the second semiconductor material, wherein the second semiconductor material comprises a top surface substantially level with top surfaces of the insulation regions, and a bottom surface lower than bottom surfaces of the insulation regions, and wherein the bottom surface of the second semiconductor material comprises a sloped portion.

17. The semiconductor device of claim 16, wherein the insulation regions are shallow trench isolation (STI) regions.

18. The semiconductor device of claim 16, wherein the bottom surface of the second semiconductor material comprises a central portion lower than the bottom surfaces of the insulation regions by greater than about 5 nm.

* * * * *